(12) United States Patent
Pei et al.

(10) Patent No.: US 6,231,366 B1
(45) Date of Patent: May 15, 2001

(54) SINGLE-POINT DRIVING MECHANISM OF A ZIF PGA SOCKET AND THE SOCKET USING THE SAME

(75) Inventors: Wen-Chun Pei, Taipei (TW); William B. Walkup, Hillsboro, OR (US)

(73) Assignee: Jon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/339,968

(22) Filed: Jun. 25, 1999

(51) Int. Cl.[7] .................................................. H01R 13/625
(52) U.S. Cl. ............................................................ 439/342
(58) Field of Search ...................... 439/342, 259, 439/266

(56) References Cited

U.S. PATENT DOCUMENTS 4,261,631 * 4/1981 Guilcher et al. .
4,420,205 * 12/1983 Kirkman ............................ 439/342
6,071,140 * 6/2000 McHugh et al. ..................... 439/342

* cited by examiner

Primary Examiner—Khiem Nguyen
(74) Attorney, Agent, or Firm—Wei Te Chung

(57) ABSTRACT

A driving mechanism is provided for a socket which comprises a cover movably mounted on a base between an open status and a closed status. The driving mechanism comprises a first reception space defined in the cover, a second reception space defined in the base and communicating with the first reception space, a driving device having an upper portion retained in the first reception space of the cover and selectively operative to move the cover in opposite directions, and a lower portion connected to the upper portion and having a positioning member operatively switchable between a first position and a second position in the second reception space of the base. The upper portion of the driving device moves the cover between the open status and the closed status depending on the relative position of the positioning member in the second reception space.

21 Claims, 8 Drawing Sheets

SINGLE-POINT DRIVING MECHANISM OF A ZIF PGA SOCKET AND THE SOCKET USING THE SAME

BACKGROUND OF THE INVENTION

1. Field of the Invention

The present invention relates to a driving mechanism of a ZIF socket and the socket using the same, and especially to a single-point driving mechanism which drives a cover of the socket to move with respect to a base thereof in opposite directions from one driving point thus rendering the socket in either a closed status or an open status.

2. The Prior Art

Conventional ZIF PGA sockets normally comprise a cover defining a plurality of upper passageways therein and slidably engaging with a base having a corresponding number of lower passageways retaining contacts therein. The upper passageways and the lower passageways are in constant communication with each other when the cover is moved with respect to the base. A cam is received in a space defined between the cover and the base and operative to move the cover with respect to the base thereby positioning the socket at either an open status ready for insertion of pins of a CPU package or a closed status forcing the pins of the CPU package to abut against the corresponding contacts. When the socket is in the open status, the pins of the CPU package are inserted into the upper passageways and the lower passageways with a substantially zero insertion force, but are not in electrical contact with the contacts retained in the lower passageways. The cam is then operated to drive the cover to move laterally relating to the base thereby urging the pins of the CPU package to electrically connect with the contacts of the base. U.S. Pat. No. 5,730,615 which belongs to the same assignee of this application has disclosed a driving mechanism for driving the cover to move with respect to the base from a single side of the socket by inserting a screwdriver into slots defined in the cover and the base and pivoting the screwdriver to drive the cover. This driving mechanism may be easily manipulated for moving the cover in one direction but it is difficult to be manipulated in opposite direction. This is because the slots may be vertically in alignment with each other when the socket is in an open status (or closed status) but they are not vertically in alignment with each other when the socket is in a closed status (or open status). The user has to insert the screwdriver to the two slots in a slanted manner thus causing difficulty when the two slots are not vertically in alignment with each other. Moreover, when the user pivots the screwdriver he (she) may be prohibited by peripheral components nearby thus causing difficulty.

It is requisite to provide a new driving mechanism which is easily manipulated without much operation space.

SUMMARY OF THE INVENTION

The primary purpose of the present invention is to provide an improved driving mechanism for a socket which is easily manipulated and only needs relatively small operation space.

In accordance with one aspect of the present invention, a driving mechanism is provided for a socket which comprises a cover movably mounted on a base. The driving mechanism comprises an upper opening and a lower opening defined in the cover, wherein the lower opening is in communication with the upper opening. A reception space is defined in the base and communicates with the lower opening of the cover. A driving cam comprises an upper circular portion rotatably received in the upper opening of the cover, a middle cam portion rotatably retained in the lower opening of the cover, and a lower circular portion rotatably retained in the reception space of the base, wherein the upper circular portion and the lower circular portion are co-axial to each other. The cover is movable along a first direction with respect to the base when the lower circular portion of the driving cam is rotated counter-clockwise within a predetermined angular range, while the cover is movable along a second direction opposite to the first direction when the lower circular portion of the driving cam is rotated clockwise within the predetermined angular range.

In accordance with another aspect of the present invention, a driving mechanism is provided for a socket which comprises a cover movably mounted on a base. The driving mechanism comprises a first reception space defined in the cover, a second reception space defined in the base and communicating with the first reception space, a driving cam having an upper cam portion rotatably retained in the first reception space of the cover and a lower circular portion connected to the upper cam portion and rotatably retained within a predetermined angular range in the second reception space of the base. The upper cam portion of the driving cam is selectively rotated either clockwise or counter-clockwise within the predetermined angular range in the first reception space thereby driving the cover to translate on the base along one of opposite directions.

In accordance a further aspect of this invention, a driving mechanism is provided for a socket which comprises a cover movably mounted on a base between an open status and a closed status. The driving mechanism comprises a first reception space defined in the cover, a second reception space defined in the base and communicating with the first reception space, driving means having an upper portion retained in the first reception space of the cover and selectively operative to move the cover in opposite directions, and a lower portion connected to the upper portion and having a positioning member operatively switchable between a first position and a second position in the second reception space of the base. Wherein the upper portion of the driving means moves the cover from the open status to the closed status when the positioning member is switched from the first position to the second position, and the upper portion of the driving means moves the cover from the closed status to the open status when the positioning member is switched from the second position to the first position.

DETAILED DESCRIPTION OF THE PREFERRED EMBODIMENT

Figure 1A:
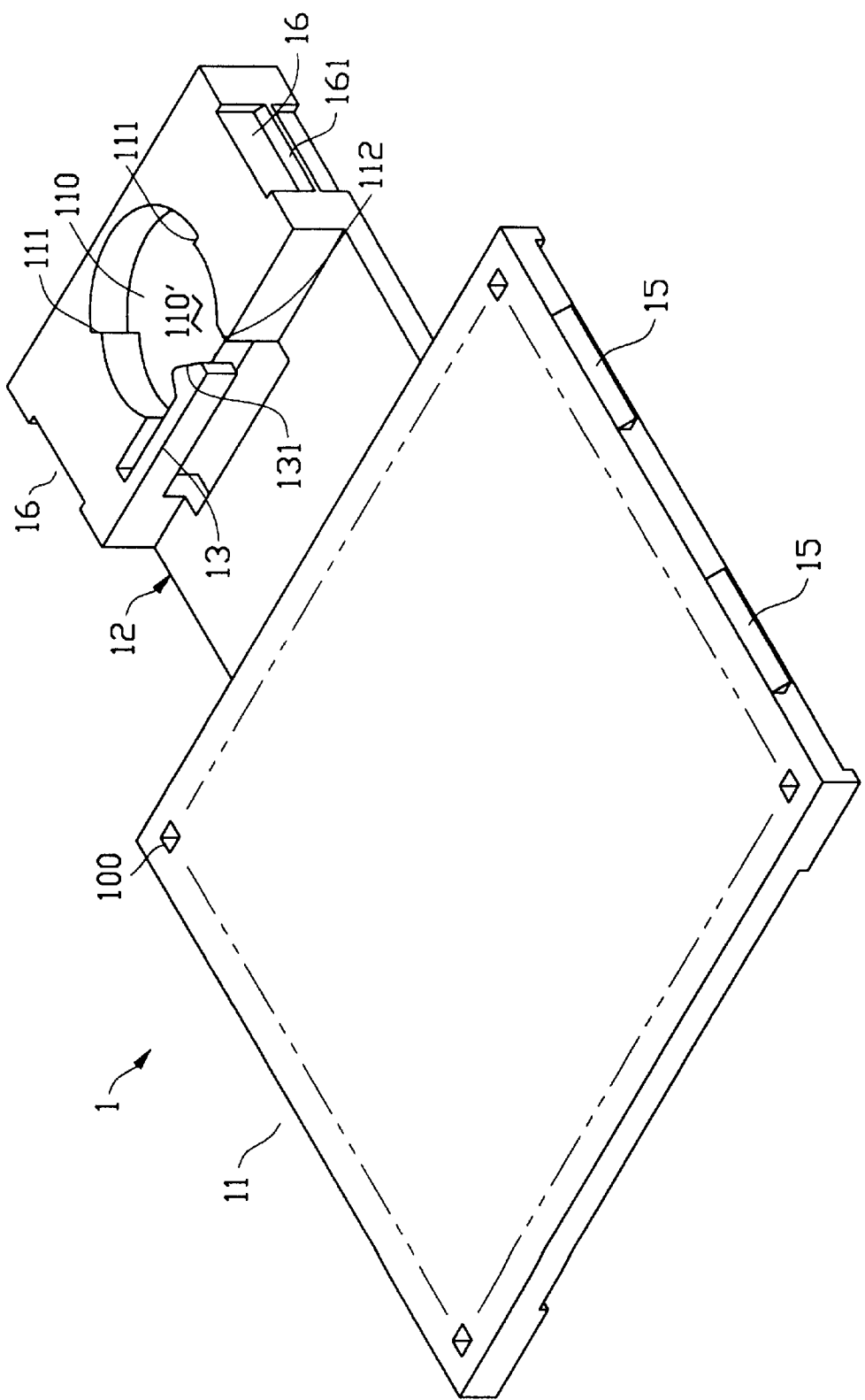
FIG. 1A is a perspective view of a base of a connector in accordance with the present invention.
Figure 1B:
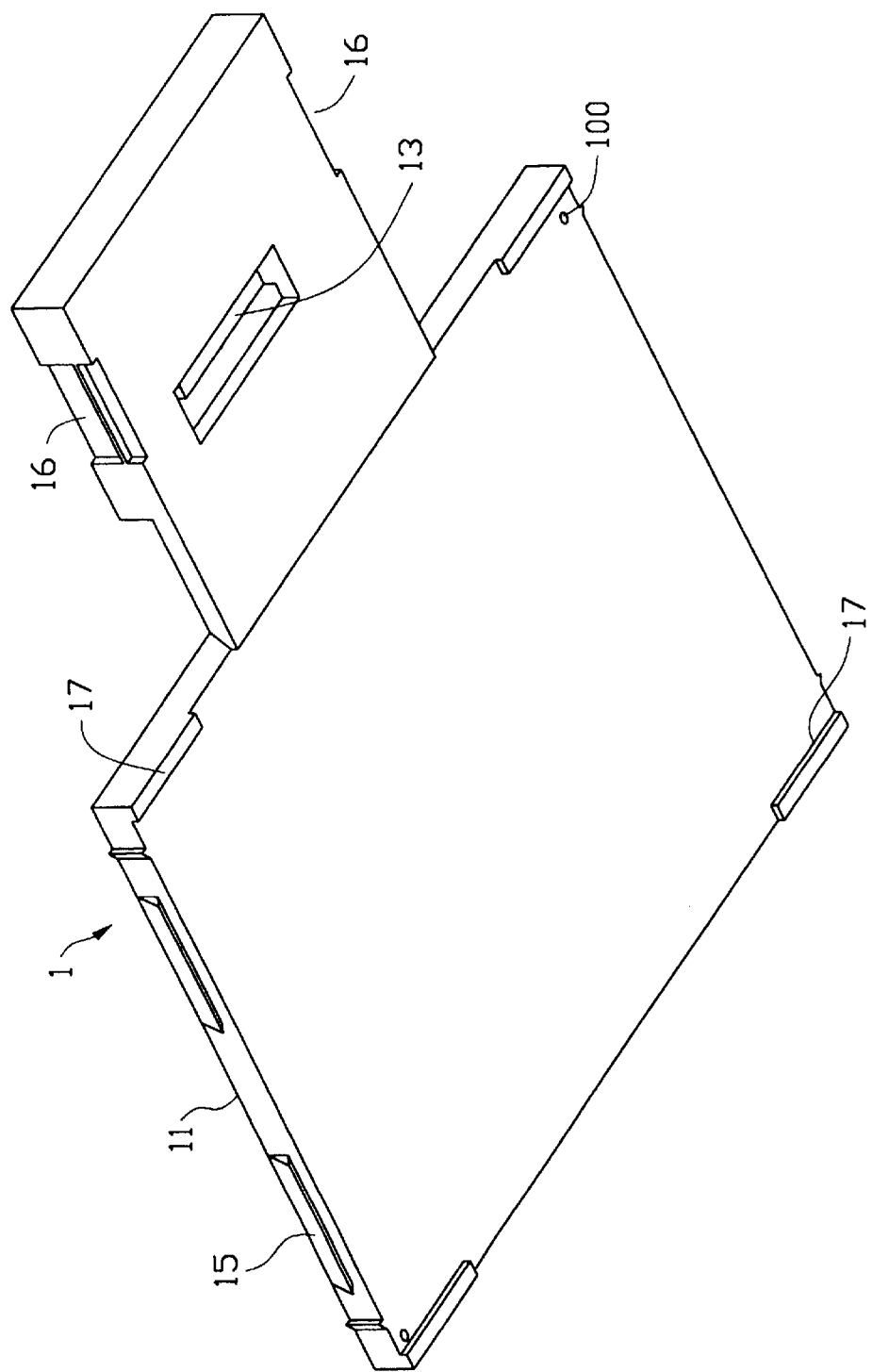
FIG. 1B is a perspective view of the base of FIG. 1A taken from a different angle.

Referring to FIG. 1A, a base 1 of a connector in accordance with the present invention comprises a housing 11 and a head 12 extending from the housing 11. The housing 11 has two sliders 15 formed in opposite sides thereof and defines a plurality of passageways 100 receiving contacts (not shown) therein for electrically and mechanically connecting to CPU pins (not shown) inserted thereinto. The head 12 defines a groove 16 in opposite sides thereof and a rib 161 extending from each groove 16. A reception cavity 110 is defined in the head 12, with two inner protrusions 111 extending from an inner periphery of the reception cavity 110. A cutout 112 is defined in a periphery portion of the reception cavity 110 as a gate therefore the cavity 110 is accessible from a horizontal direction in addition to a vertical direction. A resilient beam 13 is formed on the head 12 and includes an angled end 131 laterally extending into the reception cavity 110 through the cutout 112. The resilient beam 13 herein is integrally extended from a portion of the head 12. Alternatively, the resilient beam 13 may be connected to the portion of the head 12 by interference or the like as well known. Actually, the resilient beam 13 may be made of metal plate and connected to the portion of the head 12 by interference. Also referring to FIG. 1B, four standoffs 17 are formed at the bottom of the base prevent solder ball (not shown) attached to the contacts from being collapsed.

Figure 2A:
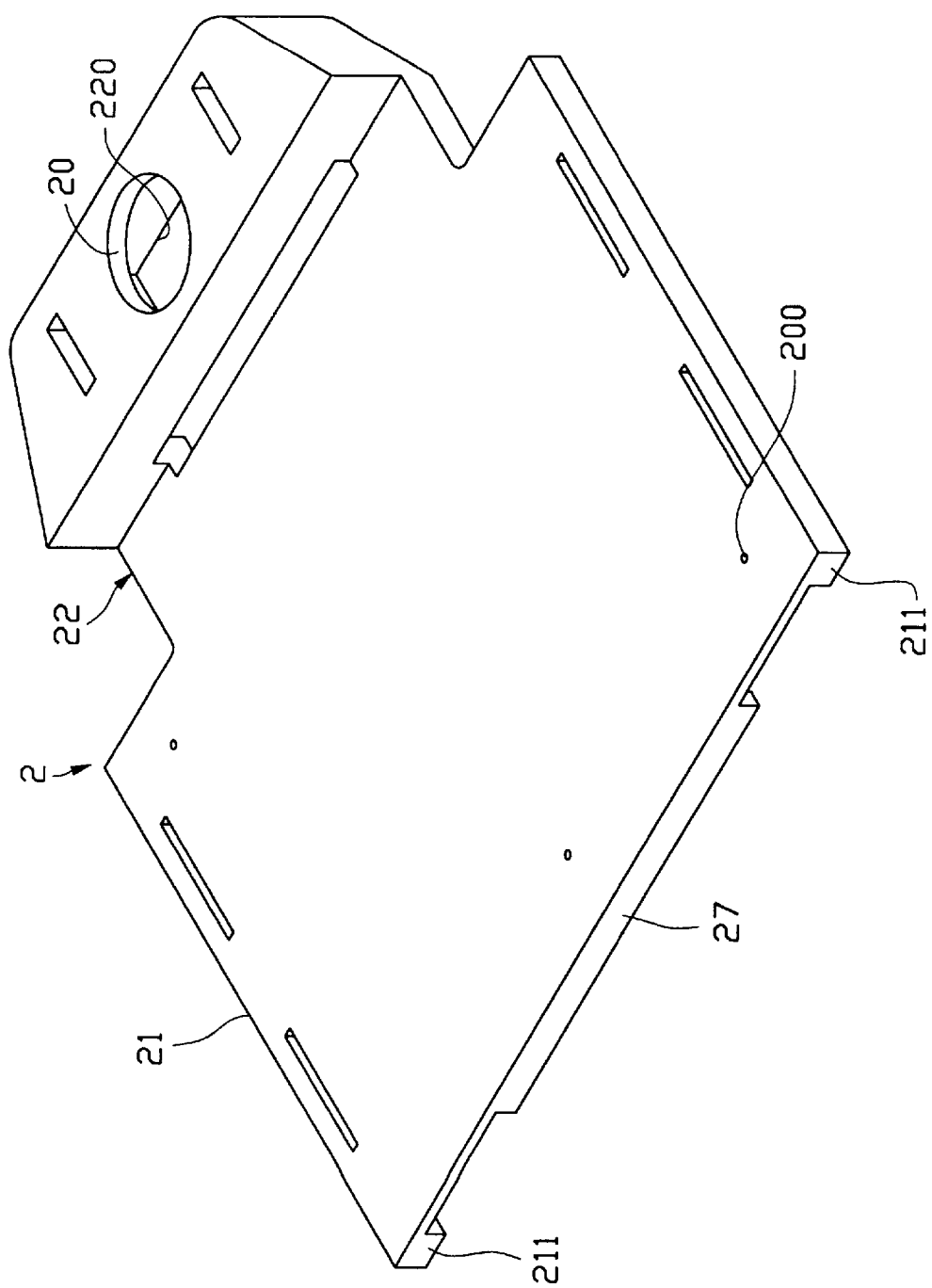
FIG. 2A is a perspective view of a cover of the connector in accordance with the present invention.
Figure 2B:
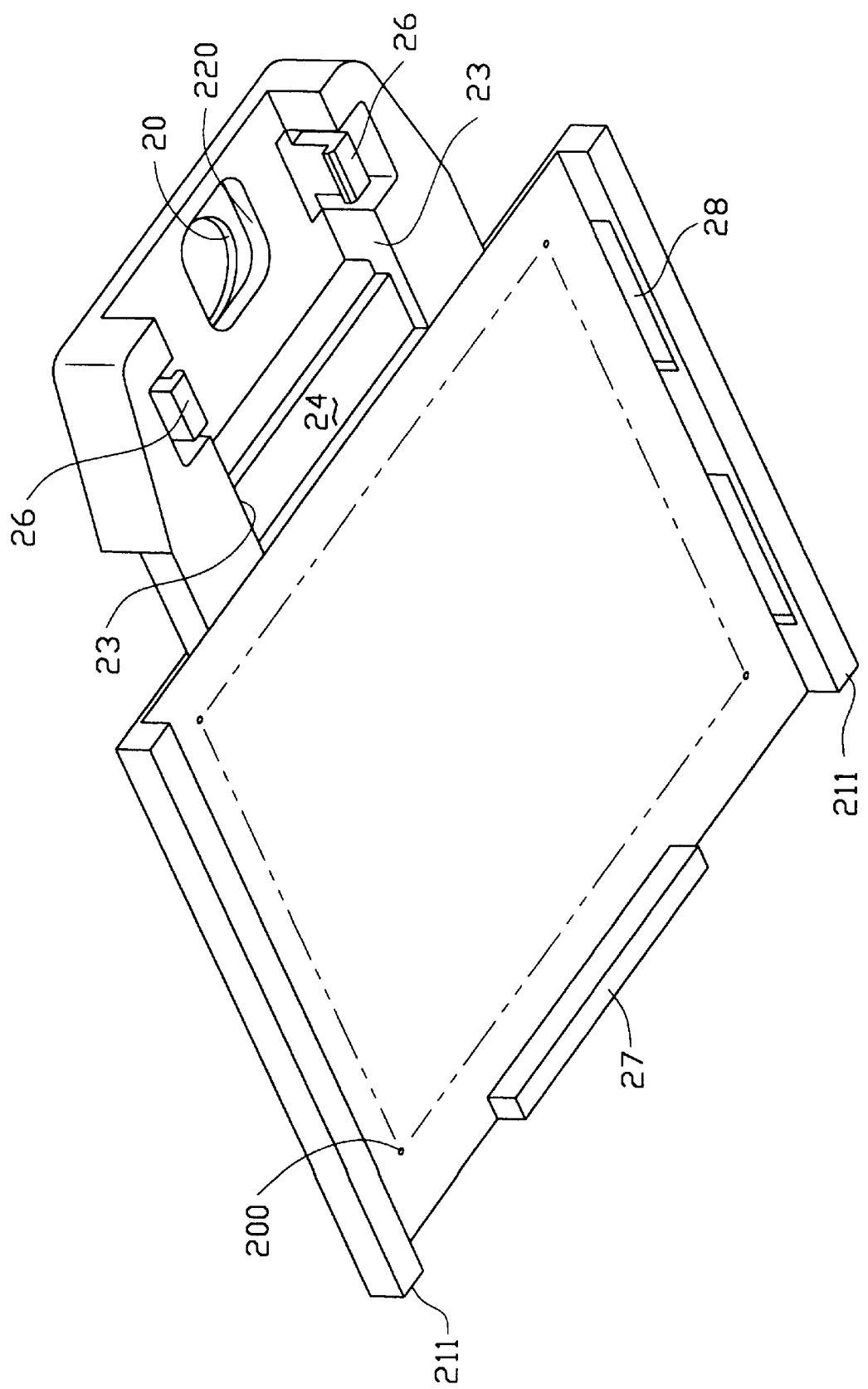
FIG. 2B is a perspective view of the cover of FIG. 1A taken from a different angle.

Referring to FIGS. 2A and 2B, a cover 2 adapted to be slidably engaged with the base 1 comprises a body portion 21 and a head 22 extending from the body portion 21. The head 22 has opposite inner walls 23 thereby defining a space 24 therebetween for movably receiving the head 12 of the base 1 therein. The body portion 21 has a plurality of conic holes 200 formed therein for receiving CPU pins (not shown) and each conic hole 200 is maintained in constant communication with a corresponding passageway 100 of the base 1 when the cover 2 is assembled to and moved on the base 1. Two guiding arms 211 extend from opposite sides of the body portion 21 and each guiding arm 211 has two guiding recesses 28 formed in inner surface thereof for slidably receiving the sliders 15 of the base 1 when the cover 2 is assembled to the base 1. A stopping bar 27 extends from a bottom surface of the body portion 21 substantially in alignment with rear side thereof for limiting a slidable distance of the cover 2 with respect to the base 1. The stopping bar 27 together with the guiding arms 211 also constitute reinforcing means preventing the cover 2 from warpage. The head 22 of the cover 2 has two resilient clamps 26 extending downward for slidably engaging with the ribs 161 of the base 1 when the cover 2 is assembled to the base 1. An upper opening 20 and a lower opening 220 are defined in the head 22 and communicated with each other. The upper opening 20 has an ellipse-like shape and the lower opening 220 has a rectangle-like shape.

Figure 3B:
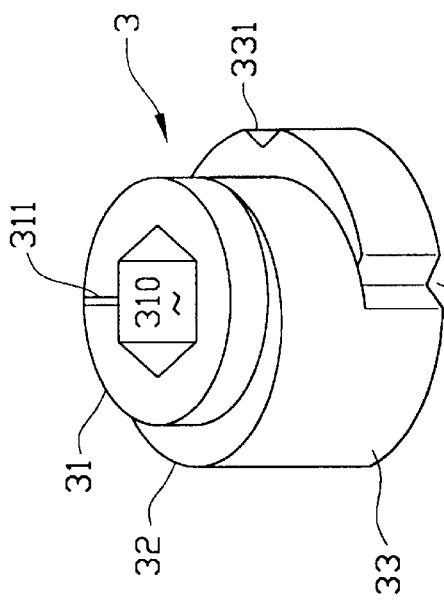
FIG. 3B is perspective view of the driving cam of FIG. 3A taken from a different angle.
Figure 3C:
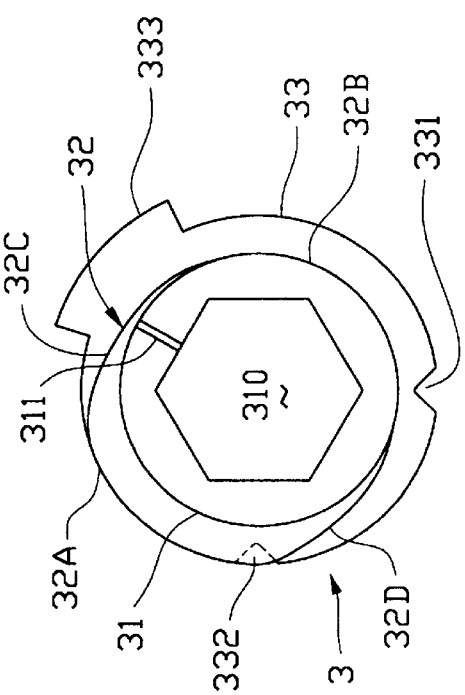
FIG. 3C is a top plan view of the driving cam.
Figure 3A:
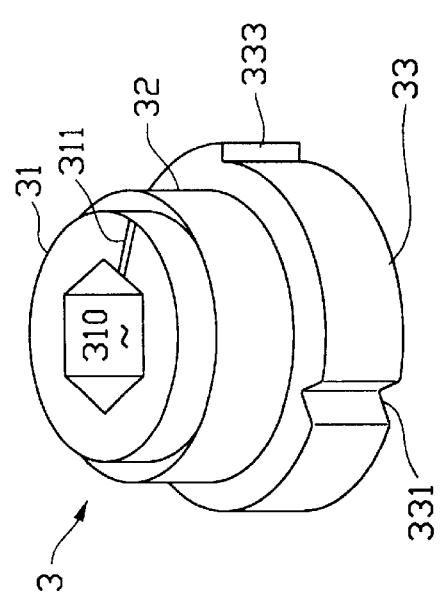
FIG. 3A is perspective view of a driving cam in accordance with the present invention.

Referring to FIGS. 3A to 3C, a driving cam 3 comprises an upper circular portion 31 connected to a middle cam portion 32 connected to a lower circular portion 33. A tool reception hole 310, herein a hexagonal hole, is defined through the driving cam 3 allowing an external tool (not shown), such as a hexagonal wrench to operate therewith for rotate the driving cam 3. An indication groove 311 is defined along a radial direction around the tool reception hole 310 for indicating the rotated angle of the driving cam 3. The tool reception hole 310 may be alternatively formed as a slit or a cross shape allowing other screwdrivers to operate therewith. The lower circular portion 33 has a first positioning groove 331 and a second positioning groove 332 formed on a periphery thereof and also an arcuate protrusion 333 extending from the periphery. Particularly referring to FIG. 3C, the upper circular portion 31 and the lower circular portion 33 are co-axial to each other.

Figure 6B:
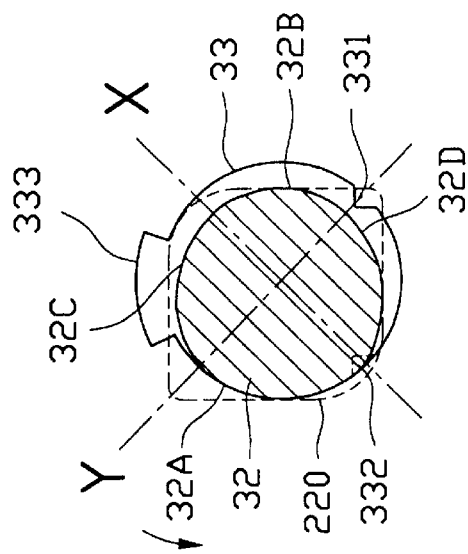
FIGS. 6A to 6C are operational schematic views of the driving cam with respect to the cover.
Figure 6A:
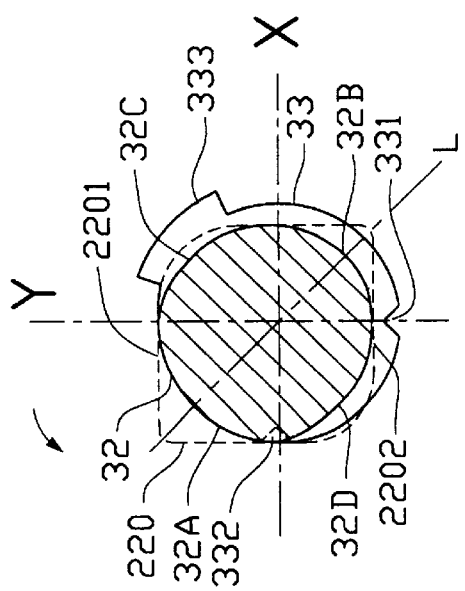

Also referring to FIG. 6A, the middle cam portion 32 has a first periphery portion 32A in alignment with one fourth of the periphery of the lower circular portion 33 and substantially located in the second quadrant of the X-Y axes, a second periphery portion 32B in alignment with one fourth of the periphery of the upper circular portion 31 and substantially located in the fourth quadrant of the X-Y axes, and a third periphery portion 32C and a fourth periphery portion 32D connected between the first and second periphery portions 32A, 32B and substantially located in the first and third quadrants of the X-Y axes, respectively. It can be noted that third periphery portion 32C and the fourth periphery portion 32D respectively located in the opposite first and third quadrants of the X-Y axes, are respectively defined with two proper curves generally symmetrical with each other to an imaginary angular bisector L along the second and fourth quadrants of the X-Y axes wherein each curve defines a first end point with a larger diameter and a second end point with a smaller diameter relative to the rotation center, i.e., the intersection point of the X-Y axes.

Figure 4:
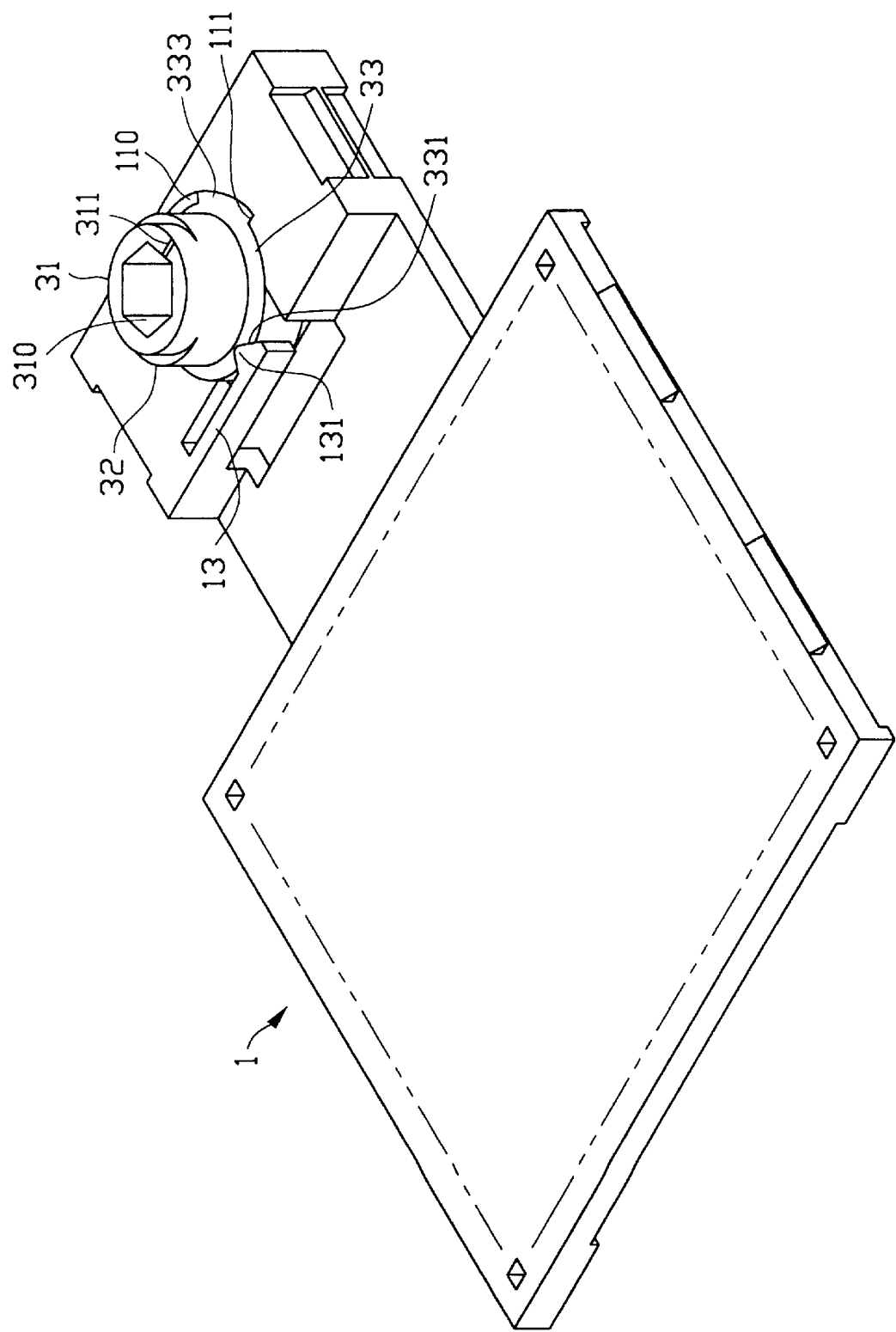
FIG. 4 is a perspective view showing the driving cam is installed in the base.

Referring to FIG. 4, the lower circular portion 33 of the driving cam 3 is assembled into reception cavity 110 of the base 1, with the upper circular portion 31 and the middle cam portion 32 remaining out of the reception cavity 110, wherein the lower circular portion 33 is rotatable within substantially a 90-degree range in the reception cavity 110 and the angled head 131 of the resilient beam 13 keeps in contact with a periphery portion of the lower circular portion 33 when the lower circular portion 33 rotates. FIG. 4 particularly shows that the lower circular portion 33 is rotated to an extreme of the 90-degree range, wherein the arcuate protrusion 333 is stopped by one of the inner protrusions 111 of the reception cavity 110 of the base 1, and the angled head 131 of the resilient beam 13 is received in the first positioning groove 331 of the lower circular portion 33.

Figure 5:
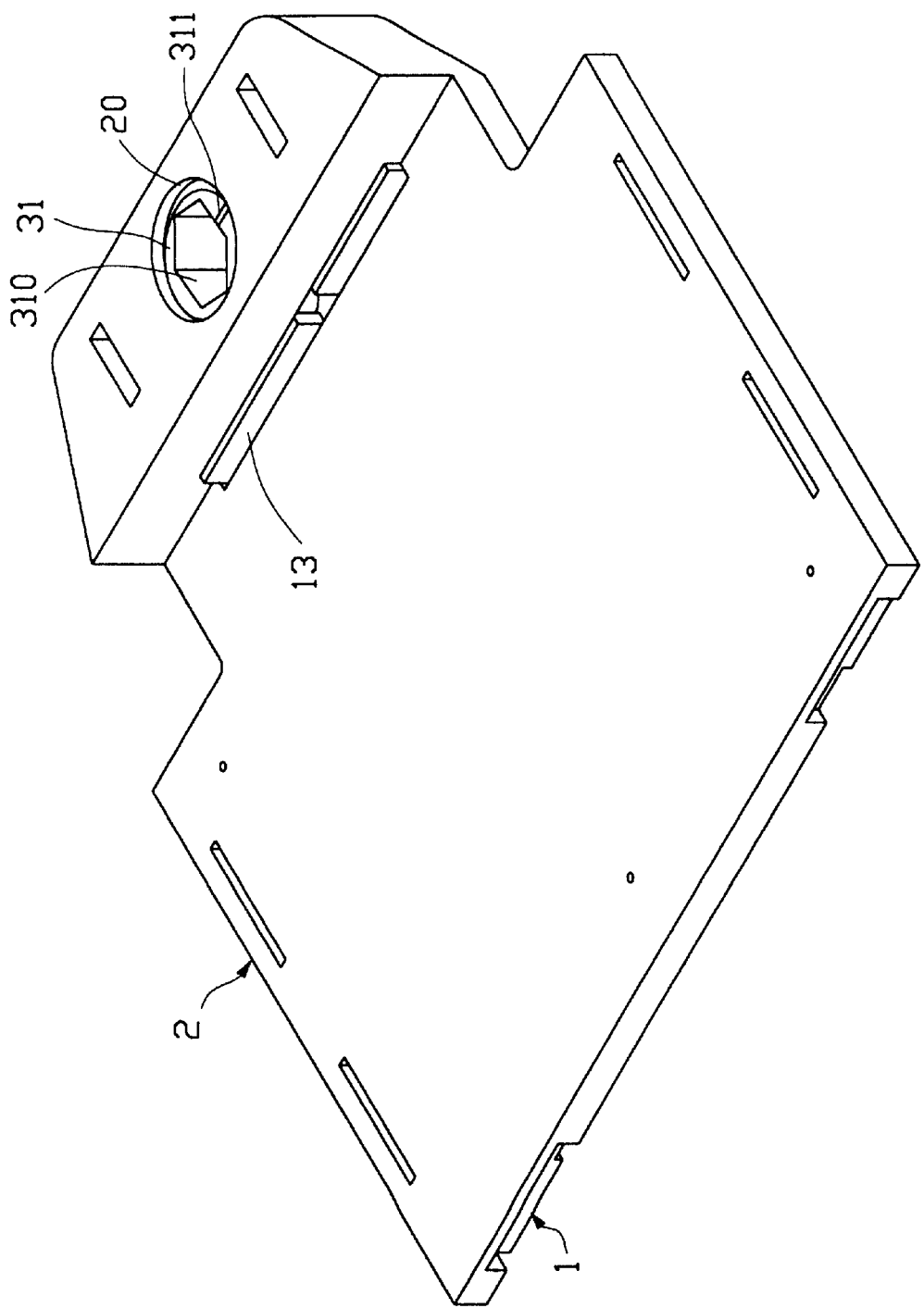
FIG. 5 is a fully assembled view of the cover, the driving cam and the base.

Referring to FIG. 5, after the driving cam 3 is assembled into the reception cavity 110 of the base 1, the cover 2 may be assembled on the base 1, with the upper circular portion 31 and the middle cam portion 32 of the driving cam respectively received in the upper opening 20 and the lower opening 220 and the tool reception hole 310 exposing to external allowing an external tool (not shown) to rotate the driving cam 3 thereby. When the cover 2 is driven by the driving cam 3 to move on the base 1, the upper opening 20 due to the ellipse-like shape thereof can be maintained straight by the upper circular portion 31 retained therein thereby guaranteeing the cover 2 to move straight along a longitudinal axis thereof without deflection.

Figure 6C:
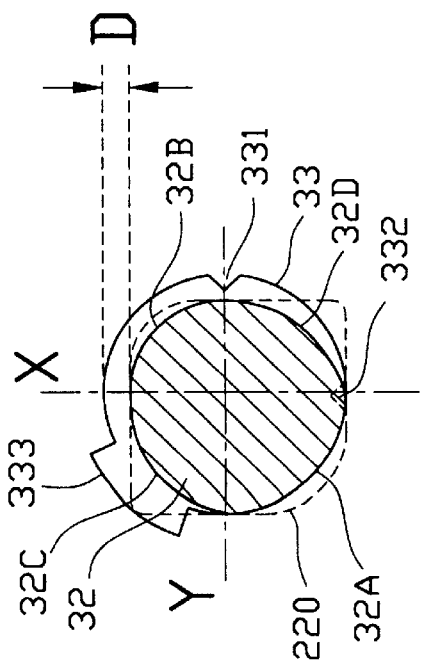

Referring to FIGS. 6A to 6C, an operational relation between the middle cam portion 32 and the cover 2 (herein schematically represented by the lower opening 220 shown by phantom line) is illustrated, wherein two axes X and Y are used to indicate the rotation of the middle cam portion 32 and the intersection point of the X and Y axes is in the co-axis of the upper circular portion 31 and the lower circular portion 33. From the sequence of FIGS. 6A to 6C, the middle cam portion 32 together with the lower circular portion 33 and the upper circular portion 31 (not shown herein but can be referred to FIG. 4) are rotated counter clockwise for substantially 90 degrees, thereby rendering the cover 2 to move along a first direction for a distance D. It is because the engagement between the curve 32D and the corresponding edge 2202 by the opening 220, is changed from the smaller diameter end point to the larger diameter end portion. Similarly, the middle cam portion 32 can be rotated clockwise from a reverse sequence thereby rendering the cover 2 to move along a second direction opposite to the first direction for the same distance D by means that the engagement between the curve 32C and the corresponding edge 2201 by the opening 220, is changed from the smaller diameter end point to the larger diameter end point.

It is noted that the driving cam 3 is retainably received within the cavity 110 of the base 1, the upper opening 20 and the lower opening 220 of the cover 2 wherein the bottom face of the lower portion 33 is seated on the supporting surface 110' of the base 1, and the upper face of the lower portion 33 and the upper face of the middle portion 32 respectively engaged with the corresponding restraint portions (not labeled) around the lower opening 220 and the upper opening 20 of the cover 2, so as to restrain the vertical movement of the cam 3 within the connector.

While the present invention has been described with reference to a specific embodiment, the description is illustrative of the invention and is not to be construed as limiting the invention. For example, the upper circular portion 31 of the driving cam 3 and the upper opening 20 of the cover 2 may be omitted, with the middle cam portion 32 directly exposed to external allowing an external tool to operate therewith for moving the cover 2 in opposite directions. Moreover, the resilient beam 13 is not necessarily formed on the base 1. Alternatively it may be formed on the cover 2. The rotation direction of the cam 3 for rendering the cover 2 to move from open status to closed status is not limited to either clockwise or counter clockwise direction. Therefore, various modifications to the present invention can be made to the preferred embodiment by those skilled in the art without departing from the true spirit and scope of the invention as defined by the appended claims.

What is claimed is:

1. A driving mechanism for a socket which comprises a cover movably mounted on a base, the driving mechanism comprising:

an upper opening and a lower opening defined in the cover, wherein the lower opening is in communication with the upper opening;

a reception space defined in the base and communicating with the lower opening of the cover;

a driving cam having an upper circular portion rotatably received in the upper opening of the cover, a middle cam portion connected to the upper circular portion and rotatably retained in the lower opening of the cover, and a lower circular portion connected to the middle cam portion and rotatably retained in the reception space of the base, the upper circular portion and the lower circular portion being coaxial to each other;

wherein the cover is movable along a first direction with respect to the base when the lower circular portion of the driving cam is rotated counter clockwise within a predetermined angular range, while the cover is movable along a second direction opposite to the first direction when the lower circular portion of the driving cam is rotated clockwise within the predetermined angular range.

2. The driving mechanism as claimed in claim 1, wherein the predetermined angular range is ninety degrees.

3. The driving mechanism as claimed in claim 1, wherein the lower circular portion of the driving cam has stop means extending from a periphery thereof adapted to be blocked by inner protrusions extending from an inner periphery of the reception space of the base when the lower circular portion is rotated to one of two extremes of the predetermined angular range.

4. The driving mechanism as claimed in claim 3, wherein the stop means is an arcuate body connected to a periphery portion of the lower circular portion.

5. The driving mechanism as claimed in claim 1, wherein the lower circular portion has two grooves formed in a periphery thereof, and the base has a resilient beam having an angled head adapted to be received in one of the two grooves of the lower circular portion when the lower circular portion is rotated to one of two extremes of the predetermined angular range.

6. The driving mechanism as claimed in claim 5, wherein a cutout is formed in a periphery portion of the reception space of the base thereby constituting a gate through which the angled head of the resilient beam of the base can be received in one of the two grooves of the lower circular portion of the driving cam.

7. The driving mechanism as claimed in claim 1, wherein the middle cam portion of the driving cam has a first periphery portion substantially in alignment with one fourth periphery portion of the lower circular portion, a second periphery portion substantially in alignment with one fourth periphery portion of the upper circular portion, a third periphery portion and a fourth periphery portion connected between the first periphery portion and the second periphery portion, and wherein the third periphery portion and the fourth periphery portion respectively drives opposite inner sides of the lower opening of the cover to move the cover to translate in opposite directions.

8. A driving mechanism for a socket which comprises a cover movably mounted on a base, the driving mechanism comprising a first reception space defined in the cover, a second reception space defined in the base and communicating with the first reception space, a driving cam having an upper cam portion rotatably retained in the first reception space of the cover and a lower circular portion connected to the upper cam portion and rotatably retained within a predetermined angular range in the second reception space of the base, wherein the upper cam portion of the driving cam is selectively rotated either clockwise or counterclockwise within the predetermined angular range in the first reception space thereby driving the cover to translate on the base along one of opposite directions;

wherein the lower circular portion has two grooves formed in a periphery thereof, and the base has a resilient beam having an angled head adapted to be received in one of the two grooves of the lower circular portion when the lower circular portion is rotated to one of two extremes of the predetermined angular range.

9. The driving mechanism as claimed in claim 8, wherein the predetermined angular range is substantially a range of ninety degrees.

10. The driving mechanism as claimed in claim 8, wherein the lower circular portion of the driving cam has stop means extending from a periphery thereof adapted to be blocked by inner protrusions extending from an inner periphery of the second reception space of the base when the lower circular portion is rotated to one of two extremes of the predetermined angular range.

11. The driving mechanism as claimed in claim 10, wherein the stop means is an arcuate body connected to a periphery portion of the lower circular portion.

12. The driving mechanism as claimed in claim 8, wherein a cutout is formed in a periphery portion of the second reception space of the base thereby constituting a gate through which the angled head of the resilient beam of the base can be received in one of the two grooves of the lower circular portion of the driving cam.

13. A driving mechanism for a socket which comprises a cover movably mounted on a base, the driving mechanism comprising a first reception space defined in the cover, a second reception space defined in the base and communicating with the first reception space, a driving cam having an upper cam portion rotatably retained in the first reception space of the cover and a lower circular portion connected to the upper cam portion and rotatably retained within a predetermined angular range in the second reception space of the base, wherein the upper cam portion of the driving cam is selectively rotated either clockwise or counter-clockwise within the predetermined angular range in the first reception space thereby driving the cover to translate on the base along one of opposite directions;

wherein the upper cam portion has a first periphery portion substantially in alignment with one fourth periphery portion of the lower circular portion, a second periphery portion substantially equaling one fourth periphery portion of a virtual circle which has a diameter different from the diameter of the lower circular portion, a third periphery portion and a fourth periphery portion connected between the first periphery portion and the second periphery portion, and wherein the third periphery portion and the fourth periphery portion respectively drives opposite inner sides of the first reception space of the cover to move the cover to translate in opposite directions.

14. A driving mechanism for a socket which comprises a cover movably mounted on a base, the driving mechanism comprising:

a first reception space and a second reception space defined in the cover and partially communicating with each other;

a third reception space defined in the base and communicating with the second reception space;

a driving cam having an upper circular portion rotatably and movably retained in the first reception space, a middle cam portion connected to the upper circular portion and rotatably retained in the second reception space, and a lower circular portion connected to the middle cam portion and rotatably retained within a predetermined range in the third reception space;

whereby the cover is translated with respect to the base along a first direction when the upper circular portion of the driving cam is rotated clockwise while the cover is translated with respect to the base along a second direction opposite to the first direction when the upper circular portion of the driving cam is rotated counter-clockwise.

15. The driving mechanism as claimed in claim 14, wherein the lower circular portion of the driving cam has stop means extending from a periphery thereof adapted to be blocked by inner protrusions extending from an inner periphery of the reception space of the base when the lower circular portion is rotated to one of two extremes of the predetermined angular range, and said stop means comprises two protrusions extending from a periphery of the lower circular portion of the driving cam.

16. The driving mechanism as claimed in claim 14, wherein the upper circular portion has a tool reception hole formed in the center thereof.

17. The driving mechanism as claimed in claim 16, wherein the upper circular portion has an indication mark formed around the tool reception hole for indication the rotation angle of the driving cam.

18. The driving mechanism as claimed in claim 14, wherein the first reception space is an elliptical-like hole for maintain the cover to move along a longitudinal direction thereof when the driving means is rotated.

19. A driving mechanism for a socket which comprises a cover movably mounted on a base between an open status and a closed status, the driving mechanism comprising a first reception space defined in the cover, a second reception space defined in the base and communicating with the first reception space, driving means having an upper portion retained in the first reception space of the cover and selectively operative to move the cover in opposite directions, and a lower portion connected to the upper portion and having a positioning member operatively switchable between a first position and a second position in the second reception space of the base, wherein the upper portion of the driving means moves the cover from the open status to the closed status when the positioning member is switched from the first position to the second position, and the upper portion of the driving means moves the cover from the closed status to the open status when the positioning member is switched from the second position to the first position.

20. A connector comprising:

a stationary base and a cover positioned thereon, said cover being moveable to the base, said base defining a first opening and said cover defining a second opening generally vertically aligned with said first opening, said second opening defining a first edge and an opposite second edge thereby in the cover;

a driving cam including a lower portion snugly rotatably received with the first opening, and an upper cam portion received within the second opening, said lower portion and said upper cam portion adapted to be rotated co-axially, said upper cam portion defining a pair of first and second curves symmetrical with each other along an imaginary line, each of said pair of curves defining a first end point with a smaller diameter and a second end point with a larger diameter wherein engagement between the first curve and the first edge changes from the first end point to the second end point and urges the cover to move in a first direction when the driving cam is rotated clockwise, and engagement between the second curve and the second edge changes from the first end point to the second end point and urges the cover to move in a second direction opposite to said first direction.

21. A connector comprising:

a stationary base and a cover moveably positioned on the base along a front-to-back direction, said base defining a first opening and said cover defining a second opening generally vertically aligned with the first opening;

means for vertically latching the cover to the base while allowing the cover to move relative to the base along said front-to-back direction;

a driving cam including a lower portion snugly received within the first opening for preventing relative radial movement of the driving cam with regard to the base, and an upper cam portion received within the second opening, said lower portion and said upper cam portion adapted to be rotated co-axially;

said base including a supporting surface around the first opening to supportably engage a bottom portion of the lower portion of the driving cam for restraining further downward movement of the driving cam, and said cover including restraint portions around the second opening to engage an upper portion of either the upper cam portion or the lower portion of the driving cam for restraining further upward movement of the driving cam, so as to prevent relative vertical movement of the driving cam within the connector.

* * * * *